United States Patent [19]

Conway

[11] Patent Number: 4,481,423
[45] Date of Patent: Nov. 6, 1984

[54] ASSEMBLY FOR OPTICAL COMMUNICATION BETWEEN HIGH AND LOW VOLTAGE COMPONENT HOUSINGS

[75] Inventor: Harry E. Conway, Baltimore, Md.

[73] Assignee: Westinghouse Electric Corp., Pittsburgh, Pa.

[21] Appl. No.: 329,159

[22] Filed: Dec. 10, 1981

[51] Int. Cl.³ .................... G02B 27/00; H01J 40/14
[52] U.S. Cl. .................................................. 250/551
[58] Field of Search ............................. 250/551, 239

[56] References Cited

U.S. PATENT DOCUMENTS 3,963,931  6/1976  Shapiro .................... 250/551 X

Primary Examiner—Edward P. Westin
Attorney, Agent, or Firm—H. W. Patterson

[57] ABSTRACT

An assembly for optical communication between a pressurized high-voltage component housing and a low-voltage component housing having respective abutting side walls.

4 Claims, 5 Drawing Figures

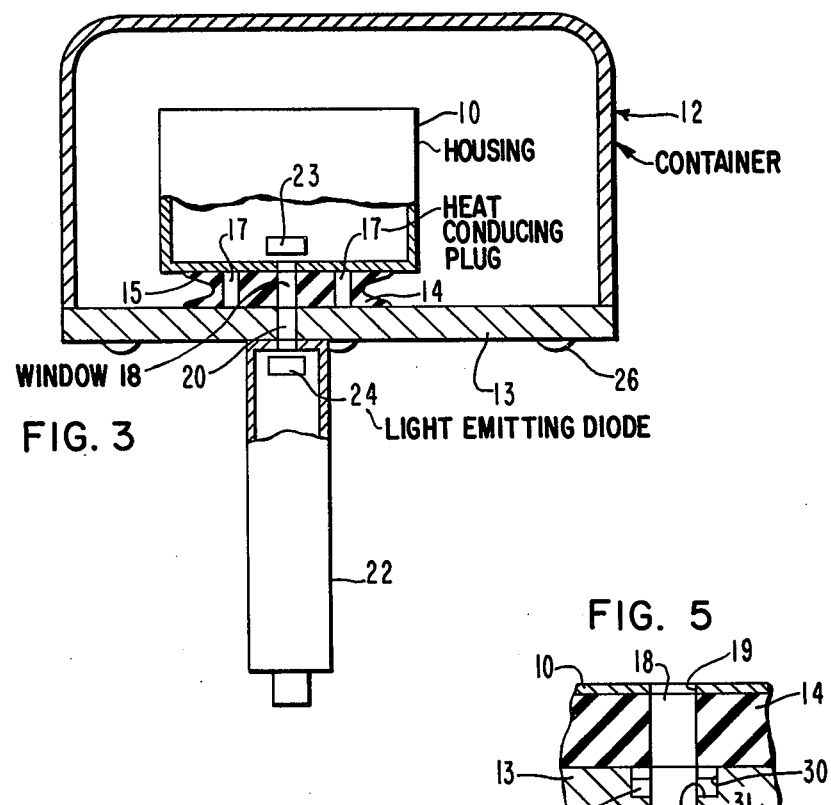
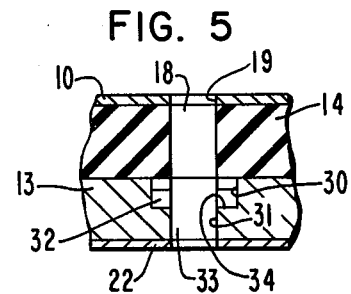
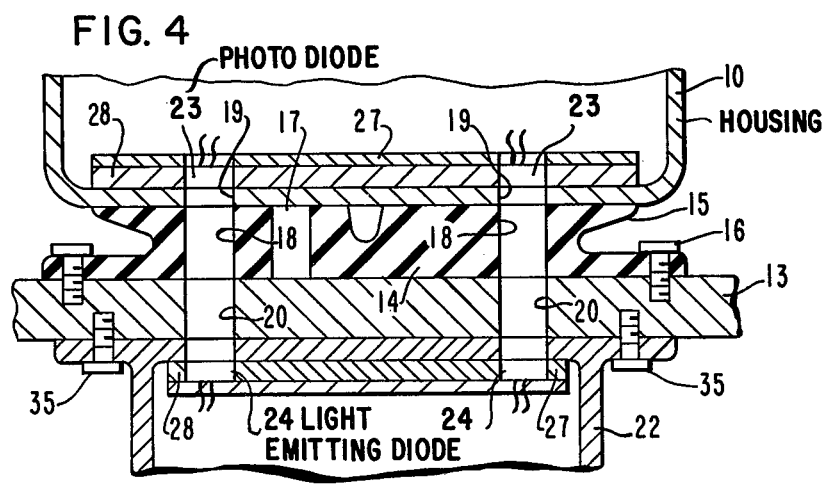

ASSEMBLY FOR OPTICAL COMMUNICATION BETWEEN HIGH AND LOW VOLTAGE COMPONENT HOUSINGS

GOVERNMENT CONTRACT

The Government has rights in this invention pursuant to Contract No. F09603-79-G-1112-SC01 awarded by the Department of the Air Force.

BACKGROUND OF THE INVENTION

The present invention relates to an improved assembly including means for optical communication between separate containers, and more particularly to an improved assembly for optical communication between low voltage electronic components housed in one container and high-voltage electronic components housed in another container that is insulatively attached to the one container.

In typical microwave communication systems, a traveling wave tube is pulsed at a predetermined frequency by a high-voltage pulsing device that is located within a sealed pressurized housing or container. The high-voltage pulsing device is controlled exterior of its sealed housing by a low-voltage pulsing device positioned within another housing or container. In the past, the two pulsing devices were inductively coupled by a transformer, which, necessarily was relatively large, and required precise construction and insulation. These inductively coupled pulses were subject to operational as well as structural shortcomings. For example, as the frequency of the pulses decreased or increased, the wave shape of such pulses changed. In order to eliminate the inductive coupling of the high-voltage and low-voltage pulses, an assembly was devised that optically coupled separate high voltage and low voltage pulses. With this arrangement, a low voltage pulse forming network switched a light-emitting diode (LED) "on" and "off" at a predetermined rate in accordance with the desired pulse width and frequency. The light from this LED was transmitted via a fiber optic guide into a high-voltage housing for reception by a photodiode. The photodiode, which was mounted in a housing that was in turn located in a pressurized housing operated the high voltage pulse forming network which pulses the traveling wave tube. Although optical coupling with fiber optics overcame the problems associated with a transformer coupling, and was satisfactory for the purpose intended, other problems became manifest. For example, such an assembly required sufficient space to route the flexible fiber optic light guide within the high-voltage pressurized assembly so as to have sufficient clearance to prevent high-voltgage breakdown. The flexible fiber optic light guides, of course, were required also to be sealed where they entered the pressurized container to prevent dielectric leakage from the high-voltage assembly. In addition to the more complicated construction of such prior art assemblies, during assembly and maintenance, the flexible optical fibers would occasionally break resulting in a reduced light reception, and at times dielectric fluid escaped from the pressurized housing through the interstices of the light fibers.

Thus, it is desirable to provide an improved assembly where low-voltage and high-voltage components, which are housed in separate containers, are optically coupled such that the problems associated with flexible optical fibers are overcome, and at the same time, permits relative simplicity of construction and maintenance.

SUMMARY OF THE INVENTION

In accordance with the present invention, there is provided an assembly that comprises a pressurized metallic container having walls of sufficient thickness for structural integrity, and at least one wall also of sufficient thickness and area to dissipate heat generated internally thereof. Such heat dissipating wall in the present embodiment constitutes a removable cover. A housing for containing components subjected to an electrical potential substantially greater than the pressurized container is positioned within the pressurized container. Insulating means that physically engage opposing walls of the housing and container separate said opposing walls, which includes the heat dissipating wall of the pressurized container. The container and housing and insulation sandwich have openings therethrough positioned to permit the passage of light from the interior of the higher potential housing to the exterior of the pressurized container. Heat conductive insulative means physically connect the housing to the pressurized container, to conduct the heat generated by the high voltage components to the dissipating wall of the pressurized container. Another housing which holds light emitting means, that is in turn pulsed by a low potential network, is attached to the heat dissipating wall of the pressurized container. Such light emitting means is positioned aligned with openings in such housing that are in turn aligned in operative position with the photodiodes when the housing is in intimate contact with the heat dissipating wall.

BRIEF DESCRIPTION OF THE DRAWINGS

FIG. 3 is an end view of the assembly of FIGS. 1 and 2;

FIG. 4 is an enlarged sectional fragmentary view of the assembly in accordance with one embodiment of the present invention; and FIG. 5 is an enlarged sectional fragmentary view illustrating another configuration of the openings in the cover of the pressurized container portion of the assembly.

DESCRIPTION OF THE PREFERRED EMBODIMENT

Figure 1:
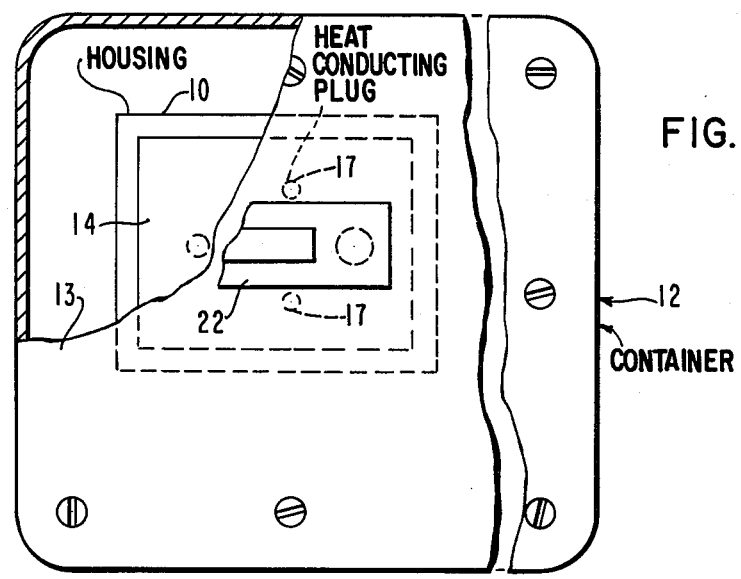
FIG. 1 is a fragmentary view of an assembly that includes a housing for high-voltage pulsing apparatus and a housing containing low-voltage pulsing apparatus fastened thereto in accordance with one embodiment of the present invention.
Figure 2:
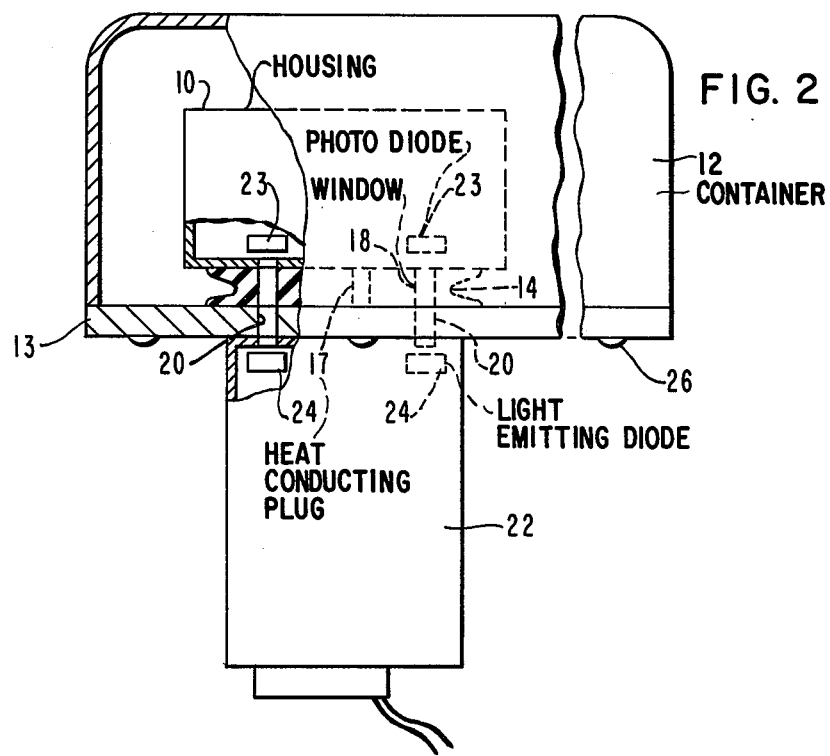
FIG. 2 is a fragmentary side elevation of the assembly of FIG. 1.

Referring to the drawings, high-voltage pulsing apparatus is mounted in a metallic housing 10, which in turn is mounted in a pressurized container 12. The chassis 10 which is at the high-voltage level of the system is connected to cover plate 13 of the container 12, but insulated therefrom by member 14 to keep the high-voltage unit isolated from the container 12, which may be at ground potential. The insulating member or pad 14 may be an epoxy glass laminate or molded epoxy that is reinforced by glass for example. Also, the member 14 has an irregular or indented peripheral surface 15 to form a long electric path between the housing 10 and cover 13 of the container 12 to prevent arcing, and to provide a recessed area for bolts 16 for connecting the housing 10 to insulating member 14. In order to conduct the heat dissipated by the high-voltage housing 10 to the cover 13, which acts as a heat sink or cold plate, plugs 17 of a heatconducting, but electrically insulating material, such as beryllium oxide, for example, are inserted between, and in contact with the housing 10 and the cover 13 of the pressurized container 12. The container 12 may have an internal pressure of approximately 30 psi and filled with a dielectric, such as sulphur hexafluoride. The insulator 14 has windows 18 which align at one end with openings 19 in the housing 10 and at the other end with windows 20 in the cover 13 of the high-voltage pressure vessel or container 12. As shown in the drawings, externally of the pressure vessel 12 and attached directly to the cover 13 thereof is a housing 22 that is substantially rectangular in configuration and includes a low-voltage pulser contained within the housing 10. The low-voltage pulser housing 22 is mounted on the outside surface of the cover 13 such that the light-emitting windows 20 are aligned with the windows 18 which in turn are aligned with openings 19. These aligned windows permit photodiodes 23 in the housing 10 of the high-voltage pulsing apparatus to communicate with light emitting diodes 24 in housing 22 of the low-voltage pulsing apparatus. Now as the light-emitting diodes 24 are switched on and off by the low-voltage pulsing apparatus, the high-voltage pulser within the housing 10 receives the light by way of its photodiodes 23 and turns the unit on and off which can create or form the pulse for a traveling wave tube. The cover 13 is fastened to enclose the bottom portion of the pressurized container 12 by suitably threaded screws 26.

Referring to FIG. 4, which illustrates the assembly in more detail, the windows 18 in the insulation 14 preferably have cemented therein such as by a wellknown flexibilized adhesive, for example, a similarly configured transparent member such as boron silicate glass or plexiglass to inhibit arcing between the container 10 and the cover 13. Also, material is cemented in the windows 20 of the cover 13 to provide a sealed transparent means of light communication. The openings 18 may be machined or molded.

The light emitting diodes 24 and the photodiodes 23 may be mounted in their respective housings 22 and 10 by means of an insulating board refered to as 27. The diodes are clamped to another respective insulating board, such as 28, that has openings therethrough into which the diodes extend. The boards 28 are then fastened to the interior surface of their respective housings. The lens or glass in the passages 18 and 20 are polished at their ends to improve light communications Referring to the alternate embodiment of FIG. 5, the openings through the cover 13 have a central diameter portion 30 of larger diameter towards the inside of the container 12 or adjacent the window 18, and a smaller diameter portion 31 adjacent the exterior of the pressurized vessel 12. With this arrangement, a glass window 33 having a diameter portion 32 similar to the portion 30 can be inserted to rest against a shoulder 34 in the opening. The glass 33 is sealed by any well known flexible adhesive. This arrangement, although relatively expensive to manufacture may be desirable for applications where the pressure differential is greater than several atmospheres, for example.

Thus, the assembly is so constituted that the alignment of the openings and passages of the four basic units; that is, the low-voltage housing 22, the cover 13, the mounting insulator 14, and the high-voltage housing 10 occurs when the units are assembled. The cover 13 which has a greater thickness than the body of the container has an exterior surface which is preferably configured to come in intimate contact with the exterior surface of a sidewall of the housing 22 to provide ease of connection through bolts such as 35. The electronic components and circuitry that constitute the high-voltage pulsing apparatus and the low-voltage pulsing apparatus are assumed to be coventional and form no part of the present invention. Thus, such components have been omitted from being shown within their respective housings 10 and 22 for the sake of clarity. Although the assembly has been shown and described with the low-voltage pulser housing being fastened to the cover 13 of the pressure vessel 12, it is contemplated that the high-voltage housing 10 and insulative member 14 could be positioned against another wall of the container or vessel 12 and the low-voltage housing could be fastened direct to another corresponding part of the pressure vessel if desired. However, the wall to which the container 10 is mounted should be of sufficient thickness to provide adequate heat dissipation. Although the advantages of the assembly of the present invention are apparent from the previous description and the drawings, it is emphasized that the primary advantage is in the provision of means for optical communication between two enclosed housings that are of unequal pressure and electrical potential, while forming an integral part of the structure. An assembly of the present invention is not only relatively simple to assemble, but also, it may be dismantled for maintenance without disturbing the pressurized housing or subjecting the individual parts to degradation because of breakage.

What I claim is:

1. An assembly for optical communications between high voltage components within a sealed first housing and lower voltage components within a second housing, comprising:

a container enclosing the first housing and being constructed to contain fluid under pressure, said container having at least one removable metallic wall with a window sealed in an opening therein to permit light to pass therethrough, said metallic wall having a thickness greater than the thickness of the remaining container walls to dissipate heat generated by the first housing within the container, a block of solid insulating material having upper and lower substantially parallel plane surfaces with a window sealed in a passage extending between the plane surfaces to permit light therethrough, a plurality of spaced plugs of heat conducting electrical insulating material inserted in openings of said block having opposite ends substantially flush with the upper and lower plane surfaces of the insulating block, said block of insulating material being attached to the heat dissipating metallic wall in the container such that its lower plane surface and the insulating plugs are in intimate heat conducting contact with said wall, said block being positioned such that the windows of the wall and insulating block are in alignment, said first housing for containing heat generating electronic components and for being at an electrical potential greater than said container being connected to the removable wall and having at least one metallic wall with a plane outer surface and an opening therethrough, said first housing being insulatively fastened within the container such that its one metallic wall is in intimate heat conducting contact with the upper plane surface and insulating plugs of the insulating block to conduct heat from the first housing through the plugs to removable heat dissipating wall of the container, said first housing being positioned in the container to have its opening in registry with the windows of the container wall and insulating block, a second housing for containing said lower voltage components having a wall of lesser peripheral dimension than the heat dissipating wall and having at least one opening therethrough, said second housing being attached exteriorly of the container to the heat dissipating metallic wall of the container in intimate contact therewith with its said opening aligned with the windows of the block and container and the opening in the first housing, and first and second means mounted within the first and second housings respectively in optical alignment with the windows in the insulation block and with each other for light communication therebetween.

2. An assembly according to claim 1 wherein the first housing is for containing high voltage electrical pulse forming apparatus, and the second housing is for containing a substantially lower voltage electrical pulse forming apparatus.

3. An assembly according to claim 2 wherein the second means is a light transmitting means, and the first means is a light responsive means.

4. An assembly according to claim 1 or 2 wherein the block of insulating material has an irregular peripheral surface to increase effectively the length of an electrical path on said surface of such periphery between the first housing and the pressurized container.

* * * * *